(12) United States Patent
Chen et al.

(10) Patent No.: US 7,754,611 B2
(45) Date of Patent: Jul. 13, 2010

(54) CHEMICAL MECHANICAL POLISHING PROCESS

(75) Inventors: Chun Fu Chen, Taipei (TW); Yung Tal Hung, Chiayi (TW); Yun Chi Yang, Hsinchu (TW)

(73) Assignee: Macronix International Co., Ltd. (TW)

( * ) Notice: Subject to any disclaimer, the term of this patent is extended or adjusted under 35 U.S.C. 154(b) by 140 days.

(21) Appl. No.: 11/364,482

(22) Filed: Feb. 28, 2006

(65) Prior Publication Data

US 2007/0202702 A1 Aug. 30, 2007

(51) Int. Cl.
*H01L 21/302* (2006.01)

(52) U.S. Cl. .................. 438/692; 438/689; 438/690; 438/691; 216/89; 252/79.1; 252/79.2; 252/79.3; 252/79.4

(58) Field of Classification Search .......... 438/692; 252/79.1; 216/89

See application file for complete search history.

(56) References Cited

U.S. PATENT DOCUMENTS

| 6,300,246 | B1 * | 10/2001 | Huynh et al. ........... 438/690 |
| 6,386,955 | B2 * | 5/2002 | Zuniga et al. ........... 451/56 |
| 6,478,665 | B2 * | 11/2002 | Lofaro ................. 451/288 |
| 7,109,117 | B2 * | 9/2006 | Tseng et al. ........... 438/690 |
| 2002/0197823 | A1 * | 12/2002 | Yoo et al. ............. 438/424 |
| 2005/0153560 | A1 * | 7/2005 | Enomoto .............. 438/692 |

* cited by examiner

*Primary Examiner*—Shamim Ahmed
*Assistant Examiner*—Maki Angadi
(74) *Attorney, Agent, or Firm*—Baker & McKenzie LLP

(57) ABSTRACT

A chemical mechanical polishing method is disclosed. The method includes forming a film on a wafer having at least one trench structure thereon; polishing the surface of the film by providing a polishing composition to provide a first polished surface; rinsing the first polished surface with a rinse composition to provide a rinsed surface; and polishing the rinsed surface by providing a second polishing composition to provide a second polished surface.

38 Claims, 2 Drawing Sheets

300

310

CHEMICAL MECHANICAL POLISHING PROCESS

BACKGROUND

1. Field of the Invention

Embodiments of the invention relate to methods of chemical mechanical polishing and related device structures.

2. Background of the Invention

Reductions in semiconductor device dimensions provide higher densities and improved performance for integrated circuits. In many integrated electronic devices, millions of discrete elements, such as transistors, resistors and capacitors are built in close proximity and integrated onto a single device. The combined layers of neighboring devices can form parasitic devices. Thus, one of the important initial steps in the fabrication of semiconductor devices is to electrically isolate adjacent electronic devices on a common substrate.

One technique for forming isolation structures is referred to as the shallow trench isolation (STI) process. To form shallow trench isolation structures a thin pad oxide is first grown on a semiconductor substrate. Thereafter a thin silicon nitride layer is deposited on the pad oxide. The pad oxide and the nitride are then etched to define the area of the isolation structure. Next, the semiconductor substrate is anisotropically etched to form a trench in the substrate. The trench is then filled with a dielectric material such as silicon dioxide. Typically in the manufacture of an integrated circuit, the deposited silicon dioxide has a very rough surface topography due to the differences in the size and the density of the trenches within the circuit. To make the final STI structure, the deposited silicon dioxide is polished off using CMP to produce a substantially planar surface.

CMP combines both chemical action and mechanical forces and is commonly used to remove metal and dielectric overlayers in damascene processes, remove excess oxide in shallow trench isolation steps, and to reduce topography across a dielectric region. Components required for CMP include a chemically reactive liquid medium and a polishing surface to provide the mechanical control required to achieve planarity. The slurry may contain inorganic particles to enhance the reactivity and mechanical activity of the process.

Typically in case of dielectric polishing, the surface may be softened by the chemical action of the slurry, and then removed by the action of the particles. CMP is the only technique currently known for producing die level flatness required for sub 0.5 µm devices and is considered a requirement for the production of sub 0.2 µm shallow device isolation structures and state-of-the-art metal interconnect schemes.

During deposition of silicon dioxide for STI formation, the surface morphology of the silicon dioxide can be extremely rough because of the wide variation in the pattern density and dimensions of the trenches. For example, the dimensions of the trenches can vary from less than 0.1 µm to 1 mm, while the spacing between the trenches can also vary by about the same amount. Additionally the density of the patterns, which is defined as the ratio of the trench area to the total area, can vary from as low as 1% to nearly 100%. These wide variations in the size, spacing, and the density of the trenches generally lead to very wide variations in the surface morphology of the silicon dioxide or other dielectric filler material to be polished.

Once the planar removal of the oxide layer is accomplished using standard silica slurries which typically operate in alkaline environments, the CMP process can generally be stopped at the underlying silicon nitride layer. The nitride layer typically has a polishing selectivity of less than 5:1 when compared to silicon dioxide polishing. However, during the polishing process, a thin residual layer can form on the diffusion area. Attempts to remove the residue by continued polishing are typically unsuccessful even after large amounts of the oxide are removed. This thin film on the diffusion area induces the formation of silicon nitride residue during or after the nitride removal process. Thus, methods of providing a shallow trench isolation structure that have reduced residue formation in the diffusion area would be useful.

SUMMARY

In one aspect, embodiments of the invention provide chemical mechanical polishing (CMP) processes that include forming a film on a wafer having at least one trench structure thereon; polishing the surface of the film by providing a polishing composition to provide a first polished surface; rinsing the first polished surface with a rinse composition to provide a rinsed surface; and polishing the rinsed surface by providing a second polishing composition to provide a second polished surface. In particular embodiments, the chemical mechanical polishing processes are applied to a silicon nitride film. Some such embodiments provide a second polished surface that is substantially free of residual silicon nitride in the diffusion areas.

In some embodiments, first polishing composition comprises ceria. Ceria may also be used in the second polishing compositing in some embodiments. While any composition suitable for removing a polishing composition may be used, the polished surface is rinsed with deionized water after the first polishing operation in particular embodiments. Other embodiments further comprising performing a slurry purge action before polishing with the second polishing composition.

In particular embodiments, the process includes forming a silicon nitride film on a wafer having at least one trench structure thereon; polishing the surface of the film by providing a ceria polishing composition to provide a first polished surface; rinsing the first polished surface with a rinse composition to provide a rinsed surface; and polishing the rinsed surface by providing a second ceria composition to provide a second polished surface.

Other embodiments of the invention provide a chemical mechanical polishing process that includes forming a silicon nitride film on a wafer having at least one trench structure thereon; polishing the surface of the film by providing a polishing composition comprising ceria to provide a first polished surface; rinsing the first polished surface with a rinse composition to provide a rinsed surface; performing a slurry purge action before polishing with the second polishing composition and polishing the rinsed surface by providing a second polishing composition comprising ceria to provide a second polished surface, wherein the second polished surface is substantially free of residual silicon nitride in the diffusion areas.

In another aspect, embodiments of the invention provide processes of forming shallow trench isolation structures. Embodiments of the invention include providing a substrate having first and second dielectric layers formed thereon and including a filled trench structure formed therein, where the trench includes a first and second dielectric liner layers and a third dielectric layer filling the trench structure; performing a first chemical mechanical polishing operation to remove portions of the first and second dielectric liner layers and portions of the third dielectric layer to provide a first polished surface; rinsing the first polished surface with a rinse composition to provide a rinsed surface; and performing a second chemical mechanical polishing operation to provide a second polished surface. Some such embodiments provide a second polished surface that is substantially free of residual silicon nitride in the diffusion areas.

In particular embodiments, the first dielectric layer is a pad oxide layer and typically the second dielectric layer is a nitride layer. Thus in some embodiments, the first dielectric liner layer is an oxide and the second dielectric liner layer is silicon nitride. In some such processes the third dielectric layer comprises an oxide formed by a high-density plasma deposition process.

While any suitable polishing composition may be used in the first chemical mechanical polishing operation, typically the polishing composition comprises ceria. In some embodiments, the first polishing composition includes an additive that selectively reduces the polishing rate of the second dielectric layer, particularly where that layer is silicon nitride. Likewise, the second polishing composition may be any suitable polishing composition, but in particular embodiments, the second polishing composition also comprises ceria.

In some embodiments, the first polished surface is rinsed with deionized water to provide a rinsed surface. Some embodiments also include performing a slurry purge action before the second chemical mechanical polishing operation.

Particular embodiments of the processes described herein include, providing a substrate having first and second dielectric layers formed thereon and including a filled trench structure formed therein, where the trench includes a first and second dielectric liner layers and a third dielectric layer filling the trench structure; performing a first chemical mechanical polishing operation to remove portions of the first and second dielectric liner layers and portions of the third dielectric layer to provide a first polished surface; rinsing the first polished surface with a rinse composition to provide a rinsed surface; performing a slurry purge action; and performing a second chemical mechanical polishing operation to provide a second polished; wherein the first dielectric liner layer is an oxide and the second dielectric liner layer is silicon nitride; and the second polished surface is substantially free of residual silicon nitride in the diffusion areas.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

In the following description, all numbers disclosed herein are approximate values, regardless whether the word "about" or "approximately" is used in connection therewith. They may vary by up to 1%, 2%, 5%, or sometimes 10 to 20%. Whenever a numerical range with a lower limit, $R_L$, and an upper limit $R_U$, is disclosed, any number R falling within the range is specifically and expressly disclosed. In particular, the following numbers R within the range are specifically disclosed: $R=R_L+k*(R_U-R_L)$, wherein k is a variable ranging from 1% to 100% with a 1% increment, i.e. k is 1%, 2%, 3%, $%, 5%, ..., 50%, 51%, 52%, ..., 95%, 96%, 97%, 98%, 99%, or 100%. Moreover, any numerical range defined by two numbers, R, as defined in the above is also specifically disclosed.

Figure 1:
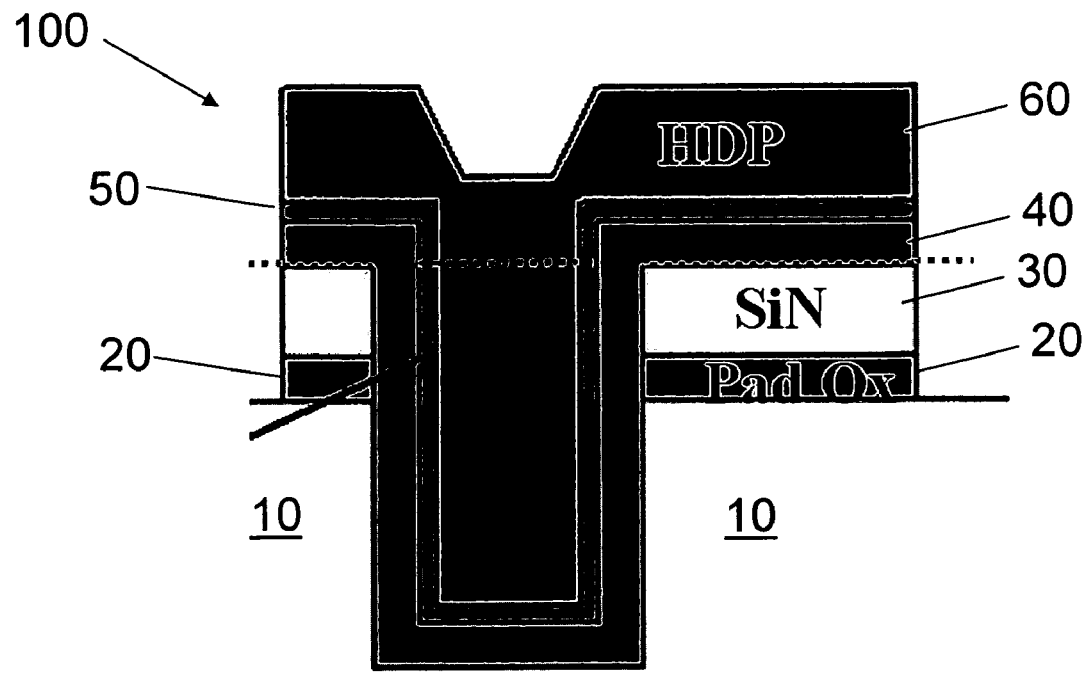
FIG. 1 schematically illustrates a shallow trench isolation structure prior to polishing to remove desired portions of the dielectric material.

FIG. 1 illustrates an embodiment of the invention for forming shallow trench isolation structure 100. The shallow trench isolation structure 100 includes a substrate 10, on which a thin pad oxide 20 is first grown. Thereafter a thin nitride layer 30, such as a silicon nitride layer, is deposited on the pad oxide 20. The pad oxide 20, the nitride layer 30, and the substrate 10 are then etched to form a trench that defines the area of the isolation structure. Typically the width of the trench ranges from about 1 to 100 μm. In some embodiments, the substrate can be anisotropically etched in a separate step and if desirable may have a trench width that is different from the width of the trench formed by etching the pad oxide 10 and nitride layer 20.

Figure 2:
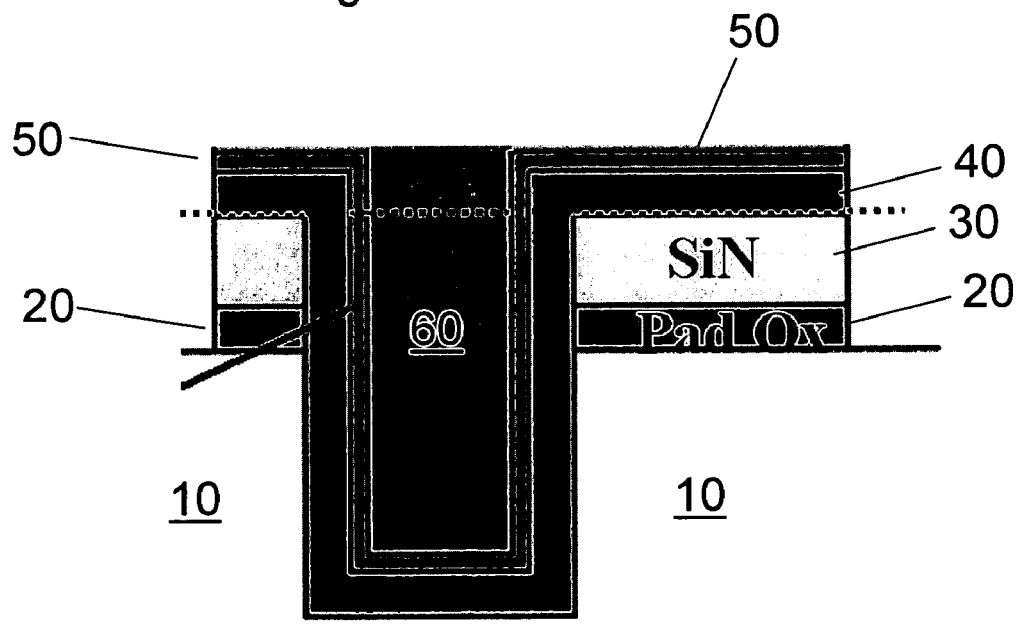
FIG. 2 schematically illustrates a shallow trench isolation structure after polishing according to an embodiment of the process described herein and indicating the substantial absence of a residual layer.

However the trench may be formed, it is then lined with a first dielectric liner layer 40. Typically, the first dielectric liner layer 40 is deposited by an isotropic deposition process. In particular embodiments, the layer 40 is a silicon dioxide layer. Thereafter, a second dielectric liner layer 50, typically silicon nitride, is provided. The remainder of the trench is then filled with a dielectric material 60, such as a tantalum oxide, silicon dioxide or other dielectric, to a height above that of the second dielectric liner layer 50. The dielectric material 60 has a very rough surface topography because the size and the density of the trenches vary within the die. To make the final STI structure, the deposited silicon dioxide is removed using embodiments of the CMP process described herein to produce a substantially planar surface as depicted in FIG. 2. Embodiments of the CMP process described herein may be applied to deep and shallow trench isolation structures, planarization of silicon dioxide and low K dielectrics, silicon nitride, alumina, and their related compounds.

In the CMP process herein a slurry is provided to the surface of the wafer comprising the isolation structure 100. Typically, the slurry includes an abrasive component and a liquid carrier phase. The abrasive component comprises a plurality of particles, preferably composite particles. The abrasive component may include particles of silica, nanoporous particles, silicon nitride, alumina, yttria, zirconia, ceria or these particles coated with silica, ceria, silicon nitride, silicon carbide, nanoporous materials, or insoluble polymeric films such as polystyrene, PTFE (Teflon). In particular embodiments, the abrasive component comprises ceria. In some embodiments, the particles can be multiphase particles, where the particle core is coated with another layer.

The primary average diameter of the particles of the abrasive component preferably varies from 5 nm to 50 microns. In particular slurries, the average diameter of the particles of the abrasive component is between 10 nm to 500 nm. The primary average diameter refers to the minimum unaggregated size of the particles. Preferred single-phase particles include ceria.

The abrasive phase is typically provided in the presence of a liquid phase that provides a colloidal suspension, usually of high ionic strength. The theory of Derjaguin, Landau, Verwey and Overbeek (DLVO theory) predicts suspension stability when the surface charge of the particles are high and the formation and overlap of the electric double layer between two particles prevents agglomeration of the particles. However, the presence of salts in high ionic strengths can screen the surface charges and destabilize the slurry. In some embodiments additives such as surfactants or polymer may be included in the slurry to aid in maintaining the stability of the slurry.

A variety of surfactants and polymer additives can be used with the invention. Surfactants are generally characterized by a hydrophilic head group and a hydrophobic tail group. Examples of tail groups include straight chain, long alkyl groups (carbon chain length varies from C8 to C20), branched chains, long chain (C8-C15) alkylbenzene residues, long chain perfluoroalkyl groups, polysiloxane groups, and high molecular weight propylene oxide polymers.

The surfactants and polymer additives can be sub-grouped in 5 classes based on the polar head group of the surfactant or polymer additive. The five groups are anionic, cationic, non-ionic, zwitterionic and polymer based additives. A slurry can comprise two or more surfactant/polymer additives chosen from any of the above 5 classes. It is possible that more than 1 additive can come from a given class.

Examples of surfactants can be found in the books "Critical Micelle Concentrations of Aqueous Surfactant Systems" by P. Mukherjee and K. Mysels, published by National Data Standards Reference Service—National Bureaus of Standards (presently called NIST)—NSRDS-NBS-36 (1971) pg. 23-50 ("Mukherjee") and "Surfactants and Interfacial Phenomena" by M. J. Rosen, John Wiley & Sons, 1989, ("Rosen"), on pages 3-32, 52-54, 70-80, 122-132, and 398-401. Mukherjee also lists the bulk CMC values of the various surfactants.

The surfactant additives described above can be supplanted or used in combination with polymeric additives such as polyethylene oxide (PEO), polyacrylic acid (PAA), polyacryamide (PAM), polyvinylalcohol (PVA), polyalkyamine (PAH) and related polymeric compounds. These polymer additives can be used as dispersants for particles in the slurry. The molecular weight of these additives can be varying from 500 to 100,000 Daltons. The concentration of these additives can vary from 1 mg/liter to 10 g/liter. A preferred concentration of the polymeric additives is from 10 mg/liter to 1 gm/liter. The preferred molecular weight of the polymer additive varies from about 1000 to 10,000 Daltons.

Polymeric additives are generally chosen based on the nature of the surface sites for polymeric adsorption. For example, if silica surface based slurry particle cores are used, the preferred choice of additives are PEO and PVA. If silicon nitride slurry particle cores are used, then preferred polymer additive is PAA, which generally strongly adsorbs to the silicon nitride cores.

Additionally, some salts may be added to control the strength of the surfactant adsorption. In some of these examples, hydrophilic head groups contain alkali metals, such as Na and K. However, it may be possible to replace the alkali metals with other ions, such as ammonium or calcium based, which may be more compatible with semiconductor processing.

Whatever slurry is selected, it is used in a first polishing action in conjunction with a CMP polishing apparatus that typically includes a polishing pad attached to a rotating platen. The polymeric pad transports the slurry below the wafer surface and participates in the wafer-particle pad interaction to remove the surface layers from the wafer. Typical pads which are commonly used include IC1000 CMP pads manufactured by Rodel Corporation, Newark, Del. The diameter of the platen wheels can vary from 10 inches to 45 inches, while the size of the wafer can vary from 1 inch to 12 inches in diameter. To maintain a fixed linear velocity, either the angular velocity can be increased or the radius of the wafer from the center can be increased. The wafer to be polished is brought into contact with the polishing pad. The wafer can either be rotated or kept stationary. In some embodiments, the wafer is moved in a circular, elliptical or in a linear manner with respect to the polishing pad and rotating platen. The pressure on the wafer is generally varied from 0.1 Psi to 10 Psi, and the rotation speed of the platen is generally varied from 5 rpm to 300 rpm.

The first polishing action is continued until the desired amount of the dielectric material 60 has been removed. After the desired amount has been removed, the polishing action is stopped and the wafer including the isolation structure 100 is rinsed with a rinse composition. Typically, the rinse composition is deionized water. In certain embodiments, distilled water can be used in place of deionized water; however, deionized water can be preferable, because deionized water can dilute the slurry and offset the balance of CeO2 slurry, i.e., additive and surfactant content, which can slow down the selectivity to make polishing over thin SiN layer 50 and oxide 40 easier.

In some embodiments, a slurry purge action is also provided after the wafer has been rinsed with the rinse composition. The purge slurry action ensures that the platen is fully covered by fresh slurry before the polishing step.

Once the wafer having isolation structure 100 has been rinsed and optionally subjected to the slurry purge action, a second polishing action is applied. The slurry used in the second polishing action may be the same or different slurry composition used in the first polishing action. In other words, the slurry can contain an abrasive component that is the same or different than that used in the first polishing action. In particular embodiments, ceria is used in the second polishing action. The second polishing action is applied to the surface of the wafer and substantially removes residual amounts of the second dielectric liner layer 50 and oxide 40 also, particularly where the layer 50 is a silicon nitride layer. Around a 100 A-200 A residual amount of the second dielectric liner layer 50 is present before application of the second polishing step, as measured using and off-line SEM check. After application of the second polishing step, however, approximately 0 A of the second dielectric liner layer 50 remains, as determined using an in-line measurement.

EXAMPLES

In Comparative Examples 1-3, a sample structure having trench and diffusion oxide layers as shown in Table I were polished with a ceria slurry. As can be seen in the first column of Table I, different polishing times were used to remove the thin layer above the diffusion SiN layer 30; however, this did not fully remove the second dielectric liner layer.

TABLE I

| Example Condition SiO2 A secs + CeO2 B secs split | Trench Ox(A) | | | | Diffusion Ox(A) | | | |
|---|---|---|---|---|---|---|---|---|
| | mean | range | Max | Min | mean | range | Max | Min |
| Comparative Example 1 A + (B − 10) | 4506 | 348 | 4615 | 4267 | 115 | 77 | 140 | 63 |

TABLE I-continued

| Example Condition SiO2 A secs + CeO2 B secs split | Trench Ox(A) | | | | Diffusion Ox(A) | | | |
|---|---|---|---|---|---|---|---|---|
| | mean | range | Max | Min | mean | range | Max | Min |
| Comparative Example 2 A + (B) | 4449 | 469 | 4595 | 4126 | 81 | 127 | 127 | 0 |
| Comparative Example 3 A + (B + 10) | 4311 | 714 | 4558 | 3844 | 65 | 123 | 123 | 0 |

TABLE II

| Example | Polishing Time | Residue thickness (A) | Rework Time |
|---|---|---|---|
| Comparative Example A | 45 sec | Residue (min = 0: max = 100), average = 101 | Rw 7 sec |
| Comparative Example B | 50 sec | Residue (min = 0: max = 100), average = 54 | Rw 7 sec |
| Comparative Example C | 55 sec | Residue (min = 0: max100), average = 70 | Rw 7 sec |
| Comparative Example D | 40 sec | Residue (min = 0: max = 109), average = 79 | Rw 7 sec |
| Comparative Example E | 50 sec | Residue (min = 0; max = 139), average = 105 | Rw 7 sec |
| Inventive Example | 40 sec + 8 sec | Cleared | |

As can be seen from the comparative examples, with a conventional process there is always a residual layer and that even increasing the polishing time, or varying the time as in the examples of Table I, does not remove this residual layer. The last column indicates that the residual layer can removed following a conventional polishing process by reworking the wafer for, e.g., 7 seconds. Reworking requires that the wafer be removed from the tool to be re-polished.

In the inventive example, however, the residue was completely removed using the two step polishing process described above, without the need to remove the wafer from the tool.

Figure 3:
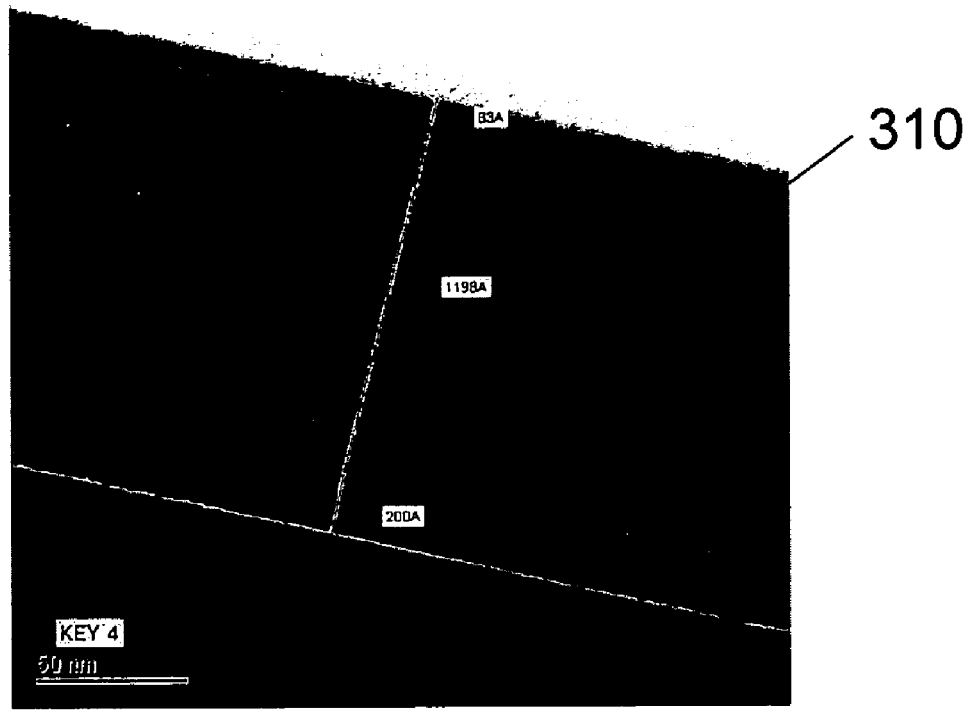
FIG. 3 shows an optical micrograph of a cross-section of a surface polished using a conventional method an having a residual layer.

In Inventive Examples 2-4, reported in Table III, the sample wafers were rinsed with deionized water for a specified time. In Examples 2 and 3 the slurry was purged followed by re-polishing as indicated in Table III. In the method of Inventive Example 4, the platen was rotated after the sample device was rinsed with deionized water. In each case, and in contrast with the comparative examples of Tables I-II, inspection of the devices by optical microscopy shows that a residue was substantially absent. FIG. 3, illustrates a comparative example wherein a device 300 was not rinsed with deionized water shows the presence of a residual layer 310.

TABLE III

| Example | Water rinse (secs) | Platen rotate (rpm) | Slurry purge (secs) | Re polishing (secs) | In-line OM |
|---|---|---|---|---|---|
| Inventive Example 2 | 14 | X | 7 | 8 | Clear |
| Inventive Example 3 | 30 | X | 7 | 8 | Clear |
| Inventive Example 4 | 30 | 20 | 15 | 8 | Clear |

Accordingly, it can be seen that use of the two step polishing process described below can fully remove the residue without the need to remove the wafer from the tool, which saves time, increases throughput, and reduces cost.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

What is claimed:

1. A chemical mechanical polishing method, comprising:
   forming a film on a wafer having at least one trench structure thereon, the trench structure including first and second dielectric liner layers sequentially disposed along sidewalls of the trench and each having portions extending away from the trench substantially parallel to an upper surface of the wafer, and the first dielectric liner layer disposed between the second dielectric liner layer and the trench sidewalls and the upper surface of the wafer;
   polishing the surface of the film by providing a first polishing composition to provide a first polished surface of the film and of the extending portion of the second dielectric liner layer overlying the upper surface of the wafer;
   rinsing the first polished surface with a rinse composition to dilute the first polishing composition; and
   polishing the first polished surface by providing a second polishing composition to provide a second polished surface of the film and of the extending portion of the first dielectric liner layer overlying the upper surface of the wafer, the extending portion of the second dielectric liner layer overlying the upper surface of the wafer being substantially removed,
   wherein the first polishing composition and the second polishing composition have the same slurry composition.

2. The method of claim 1, wherein the film is a silicon nitride film.

3. The method of claim 2, wherein the first polishing composition includes an additive that selectively reduces the polishing rate of the film.

4. The method of claim 1, wherein the first polishing composition comprises ceria.

5. The method of claim 1, wherein the second polishing composition comprises ceria.

6. The method of claim 1, wherein the rinse composition is deionized water.

7. The method of claim 1, further comprising performing a slurry purge action before polishing with the second polishing composition.

8. The method of claim 1, wherein the film is a silicon nitride film, and the first and second polishing compositions comprise ceria.

9. The method of claim 1, wherein second polished surface is substantially free of residual silicon nitride in the diffusion areas.

10. The method of claim 1, further comprising performing a slurry purge action before polishing with the second polishing composition, the film is a silicon nitride film, and the first and second polishing compositions comprise ceria, and the second polished surface is substantially free of residual silicon nitride in the diffusion areas.

11. A method of forming shallow trench isolation, comprising:
   providing a substrate having first and second dielectric layers formed thereon and including a filled trench structure formed therein, where the trench includes a first and second dielectric liner layers that both overlie the first and second dielectric layers and a third dielectric layer filling the trench structure, the first dielectric liner layer disposed between the second dielectric liner layer and the first and second dielectric layers;
   performing a first chemical mechanical polishing operation using a first polishing composition to remove portions of the second dielectric liner layer and portions of the third dielectric layer to provide a first polished surface of the second dielectric liner layer overlying the first and second dielectric layers and of the third dielectric layer within the trench structure;
   rinsing the first polished surface with a rinse composition to dilute the first polishing composition; and
   performing a second chemical mechanical polishing operation using a second polishing composition to provide a second polished surface of the film and of the first dielectric liner layer overlying the first and second dielectric layers, the second dielectric liner layer overlying the first and second dielectric layers being substantially removed,
   wherein the first polishing composition and the second polishing composition have the same slurry composition.

12. The method of claim 11, wherein the first dielectric layer is a pad oxide layer.

13. The method of claim 11, wherein the second dielectric layer is a nitride layer.

14. The method of claim 13, where in the third dielectric layer comprises an oxide formed by a high-density plasma deposition process.

15. The method of claim 11, wherein the first dielectric liner layer is an oxide and the second dielectric liner layer is silicon nitride.

16. The method of claim 11, further including:
   placing the substrate onto a platen prior to the performing the first chemical mechanical polishing operation; and
   rotating the platen to a set rotational velocity of about 20 rotations per minute (rpm) prior to performing the second chemical mechanical polishing operation.

17. The method of claim 11, wherein the first polishing composition includes ceria.

18. The method of claim 11, wherein the second polishing composition includes ceria.

19. The method of claim 11, wherein the rinse composition is deionized water.

20. The method of claim 11, further comprising performing a slurry purge action before the second chemical mechanical polishing operation.

21. The method of claim 11, wherein second polished surface is substantially free of residual silicon nitride in the diffusion areas.

22. The method of claim 11, further comprising:
   performing a slurry purge action before the second chemical mechanical polishing operation;
   the first dielectric liner layer is an oxide and the second dielectric liner layer is silicon nitride; and
   the second polished surface is substantially free of residual silicon nitride in the diffusion areas.

23. The method of claim 11, wherein the rinsing the first polished surface includes removing surfactant from the first polished surface.

24. The method of claim 11, wherein the rinsing the first polished surface changes balance of the slurry composition.

25. The method of claim 24, wherein the balance includes additive and surfactant contents of the slurry composition.

26. The method of claim 1, wherein the rinsing the first polished surface includes removing surfactant from the first polished surface.

27. The method of claim 1, wherein the rinsing the first polished surface changes balance of the slurry composition.

28. The method of claim 27, wherein the balance includes additive and surfactant contents of the slurry composition.

29. A chemical mechanical polishing method, comprising:
   forming an insulating layer on a surface of a wafer;
   forming at least one trench structure through the insulating layer and the surface of the wafer;
   lining the at least one trench with a first dielectric material, the lining having a first portion extending onto the insulating layer;
   filling the at least one trench with a second dielectric material to overly the first portion of the first dielectric material;
   polishing a surface of the second dielectric material to remove a first portion of the second dielectric material and to leave a second portion of the second dielectric material extending above the first portion of the first dielectric material by providing a first polishing composition to provide a first polished surface of the second dielectric material;
   rinsing the first polished surface with a rinse composition to dilute the first polishing composition; and
   polishing the first polished surface by providing a second polishing composition to remove the second portion of the second dielectric and to provide a second polished surface of the second dielectric material,
   wherein the first polishing composition and the second polishing composition have the same slurry composition.

30. The method of claim 29, further comprising performing a slurry purge action before polishing with the second polishing composition.

31. The method of claim 29, wherein the second dielectric material includes silicon nitride, and the first and second polishing compositions comprise ceria.

32. The method of claim 29, wherein the insulating layer includes a pad oxide layer.

33. The method of claim 32, wherein the insulating layer includes a nitride layer.

34. The method of claim 29, wherein the first dielectric material includes an oxide layer and a silicon nitride layer.

35. The method of claim 29, further including:
   placing the wafer onto a platen prior to performing the polishing of the surface of the second dielectric material; and
   rotating the platen to a set rotational velocity of about 20 rotations per minute (rpm) prior to performing the polishing of the first polished surface of the second dielectric material.

36. The method of claim 29, wherein the rinsing the first polished surface includes removing surfactant from the first polished surface.

37. The method of claim 29, wherein the rinsing the first polished surface changes balance of the slurry composition.

38. The method of claim 37, wherein the balance includes additive and surfactant contents of the slurry composition.

* * * * *